(12) United States Patent
Chou et al.

(10) Patent No.: US 11,147,180 B2
(45) Date of Patent: Oct. 12, 2021

(54) WATERPROOF CASING

(71) Applicant: Delta Electronics, Inc., Taoyuan (TW)

(72) Inventors: Ching-Ho Chou, Taoyuan (TW);
Po-Heng Chao, Taoyuan (TW);
Hung-Chi Chen, Taoyuan (TW)

(73) Assignee: DELTA ELECTRONICS, INC.,
Taoyuan (TW)

(*) Notice: Subject to any disclaimer, the term of this patent is extended or adjusted under 35 U.S.C. 154(b) by 0 days.

(21) Appl. No.: 16/799,665

(22) Filed: Feb. 24, 2020

(65) Prior Publication Data
US 2020/0221600 A1 Jul. 9, 2020

Related U.S. Application Data

(63) Continuation-in-part of application No. 16/278,164, filed on Feb. 17, 2019.

(30) Foreign Application Priority Data

Sep. 19, 2018 (CN) .......................... 201811092413.1
Sep. 2, 2019 (CN) .......................... 201910821730.0

(51) Int. Cl.
*H05K 5/00* (2006.01)
*H05K 7/14* (2006.01)
(Continued)

(52) U.S. Cl.
CPC ......... *H05K 7/1427* (2013.01); *H05K 5/0217* (2013.01); *H05K 5/03* (2013.01); *H05K 5/04* (2013.01)

(58) Field of Classification Search
CPC .. H05K 7/14; H05K 5/03; H05K 5/02; H05K 5/04; H05K 5/0217; H05K 7/1427;
(Continued)

(56) References Cited

U.S. PATENT DOCUMENTS 4,791,717 A * 12/1988 Hemmie ................. H01P 1/205
174/560
5,020,149 A * 5/1991 Hemmie ................. H01P 1/205
174/541
(Continued)

FOREIGN PATENT DOCUMENTS

CN         1216283 A      5/1999
CN       201533234 U      7/2010
(Continued)

*Primary Examiner* — Angel R Estrada
(74) *Attorney, Agent, or Firm* — Kirton McConkie; Evan R Witt

(57) ABSTRACT

A waterproof casing for packaging a circuit board is provided. The circuit board comprises an antenna. The waterproof casing comprises a metallic casing, a non-metallic end cover and a sealing gasket. The metallic casing comprises an accommodation space and a side opening in communication with each other. The accommodation space is configured to accommodate the circuit board. The antenna is adjacent to the side opening. The non-metallic end cover covers the side opening and combined with the metallic casing to form a sealed box. The non-metallic end cover comprises a ring-shaped install portion disposed on a surface thereof and extending outwardly from the surface. The ring-shaped install portion is disposed in the accommodation space as the non-metallic end cover covers the side opening. The sealing gasket is disposed around the ring-shaped install portion. A joint between the metallic casing and the non-metallic end cover is sealed by the sealing gasket.

5 Claims, 3 Drawing Sheets

(51) Int. Cl.
 *H05K 5/04* (2006.01)
 *H05K 5/02* (2006.01)
 *H05K 5/03* (2006.01)
(58) Field of Classification Search
 CPC .. H05K 7/1422; H05K 5/0204; H05K 5/0247; H05K 5/00; H02G 3/08; H02G 3/081; H02G 3/088
 USPC ..... 174/50, 520, 50.51, 50.5, 535, 559, 560; 220/3.2–3.9, 4.02, 241, 242; 361/752, 361/736, 641, 719, 600, 601
 See application file for complete search history.

(56) References Cited

U.S. PATENT DOCUMENTS

| | | | | |
|---|---|---|---|---|
| 5,942,728 | A * | 8/1999 | Chen | H02B 1/28 |
| | | | | 174/255 |
| 6,069,317 | A * | 5/2000 | Wagganer | H02G 3/088 |
| | | | | 174/650 |
| 6,455,768 | B2 * | 9/2002 | Negishi | H05K 5/061 |
| | | | | 174/135 |
| 6,831,222 | B2 * | 12/2004 | Pastuch | H02G 15/043 |
| | | | | 174/17 CT |
| 7,563,991 | B2 * | 7/2009 | Twitchell, Jr. | H05K 5/0004 |
| | | | | 174/560 |
| 8,053,668 | B2 * | 11/2011 | Lai | H05K 9/0009 |
| | | | | 174/50 |
| 8,519,264 | B2 * | 8/2013 | Leslie | F16J 15/061 |
| | | | | 174/50 |
| D692,827 | S | 11/2013 | Chen et al. | |
| 8,772,635 | B2 * | 7/2014 | Chen | H05K 5/061 |
| | | | | 174/50 |
| 8,796,548 | B2 * | 8/2014 | Rost | H05K 5/061 |
| | | | | 174/50 |
| 8,902,599 | B2 | 12/2014 | Chao et al. | |
| 9,565,744 | B2 | 2/2017 | Lai et al. | |
| 2013/0141637 | A1 | 6/2013 | Kaga | |
| 2013/0154900 | A1 | 6/2013 | Tsai et al. | |
| 2013/0258616 | A1 | 10/2013 | Chao et al. | |
| 2013/0286597 | A1 | 10/2013 | Zhang | |
| 2014/0096993 | A1 | 4/2014 | Chen et al. | |

FOREIGN PATENT DOCUMENTS

| | | |
|---|---|---|
| CN | 201925841 U | 8/2011 |
| CN | 202521573 U | 11/2012 |
| CN | 202915193 U | 5/2013 |
| CN | 103369896 A | 10/2013 |
| CN | 103543633 A | 1/2014 |
| CN | 204217169 U | 3/2015 |
| CN | 106061174 A | 10/2016 |
| CN | 206145627 U | 5/2017 |
| CN | 107846804 A | 3/2018 |
| CN | 107866943 A | 4/2018 |
| CN | 108638749 A | 10/2018 |
| JP | 2003152351 A | 5/2003 |
| TW | 200917570 A | 4/2009 |
| TW | 201140931 A | 11/2011 |
| TW | M527616 U | 8/2016 |
| WO | 2015025267 A1 | 2/2015 |

\* cited by examiner

WATERPROOF CASING

CROSS-REFERENCE TO RELATED APPLICATION

This application claims priority to China Patent Application No. 201910821730.0 filed on Sep. 2, 2019. This application is a continuation-in-part application of U.S. application Ser. No. 16/278,164 filed on Feb. 17, 2019 and entitled "WATERPROOF CASING OF OUTDOOR WIRELESS ELECTRONIC DEVICE", which claims priority to China Patent Application No. 201811092413.1 filed on Sep. 19, 2018. The entire contents of the above-mentioned patent applications are incorporated herein by reference for all purposes.

FIELD OF THE INVENTION

The present disclosure relates to a waterproof casing, and more particularly to a waterproof casing for packaging an antenna therein and increasing the reliability and the sealing tightness thereof.

BACKGROUND OF THE INVENTION

Nowadays, an electronic device with a wireless function has been widely applied in the markets. For avoiding electronic components of the electronic device disposed within a casing being damaged, the electronic device with wireless function employs a metallic casing to protect the electronic components. However, the metallic casing blocks the signal transmission of the wireless function. Therefore, a wireless transmission signal of the antenna is hard to transmit from the interior of the casing to the exterior of the casing. For transmitting the wireless transmission signal of the antenna easily, portion of the metallic casing of the electronic device is cut so as to form a communication opening on the metallic casing, and then a non-metallic mask is attached to the metallic casing to cover the communication opening. Consequently, the wireless transmission signal of the antenna is transmitted to the exterior of the metallic casing through the non-metallic mask.

However, in case that the electronic device with wireless function is disposed on the outdoor environment, the electronic device requires a waterproof capability to prevent rainwater or liquid from entering the interior of the casing and damaging the electronic elements disposed within the casing. The joint between the communication opening of the metallic casing and the non-metallic mask may form gaps easily so that rainwater or liquid may be introduced into the interior of the casing through the gaps easily. Consequently, the conventional casing fails to have the waterproof function and allow the antenna therein to perform the wireless function at the same time.

Therefore, there is a need of providing a waterproof casing so as to overcome the drawbacks of the conventional technologies.

SUMMARY OF THE INVENTION

An object of the present disclosure provides a waterproof casing for packaging an antenna therein and increasing the reliability and the sealing tightness thereof.

In accordance with an aspect of the present disclosure, a waterproof casing for packaging a circuit board is provided. The circuit board comprises an antenna. The waterproof casing comprises a metallic casing, a non-metallic end cover and a sealing gasket. The metallic casing comprises an accommodation space and a side opening in communication with each other. The accommodation space is configured to accommodate at least part of the circuit board, and the antenna is adjacent to the side opening. The non-metallic end cover covers the side opening and combined with the metallic casing to form a sealed box. The non-metallic end cover comprises a ring-shaped install portion disposed on a surface thereof and extending outwardly from the surface thereof. The ring-shaped install portion is disposed in the accommodation space as the non-metallic end cover covers the side opening. The sealing gasket is disposed around the ring-shaped install portion of the non-metallic end cover. A joint between the metallic casing and the non-metallic end cover is sealed by the sealing gasket.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
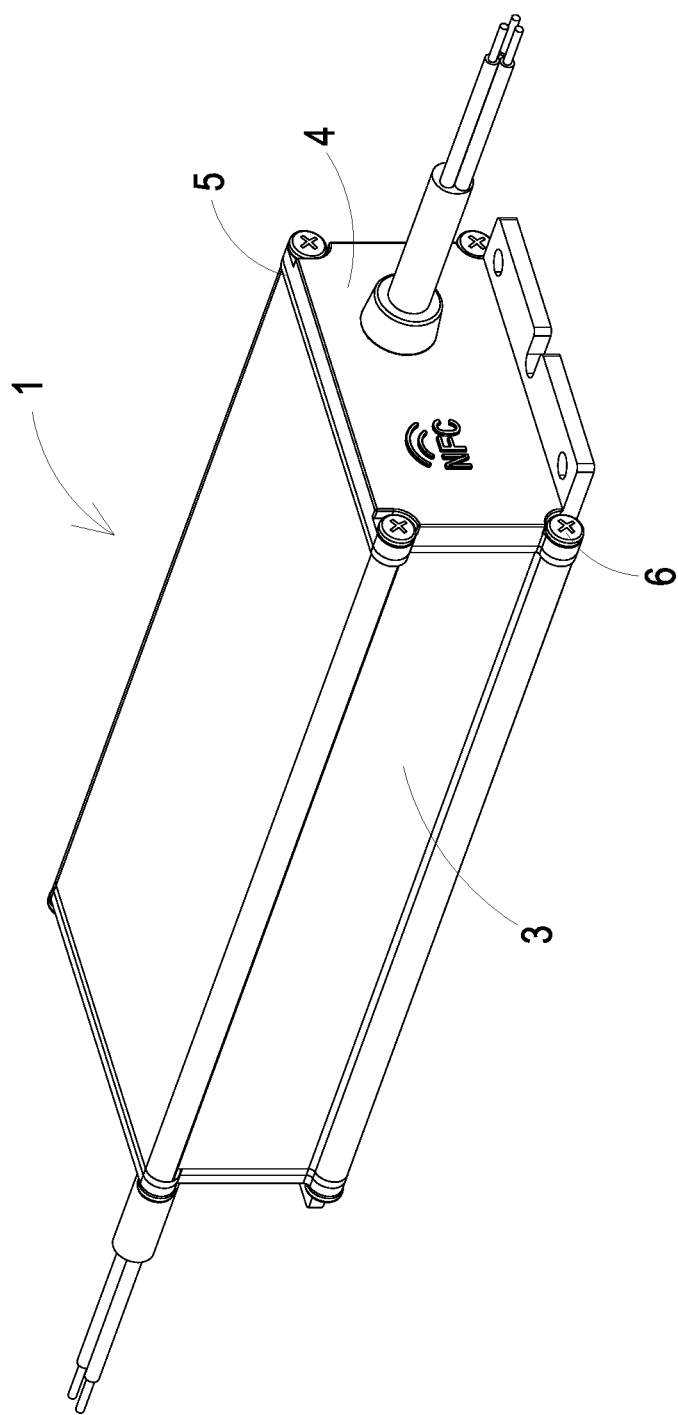
FIG. 1 is a schematic perspective view illustrating a waterproof casing according to a first embodiment of the present disclosure.
Figure 2:
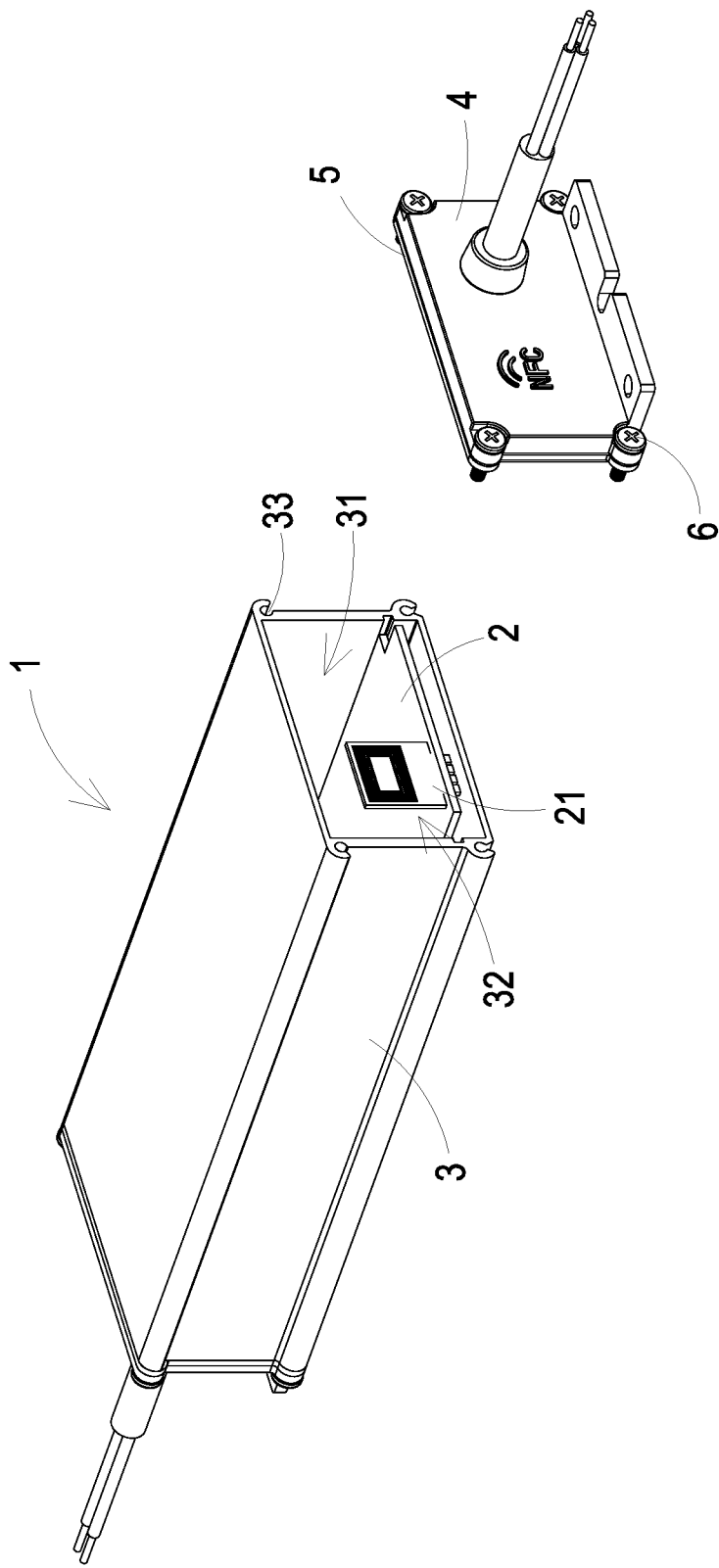
FIG. 2 is a schematic exploded view illustrating the waterproof casing of FIG. 1.
Figure 3:
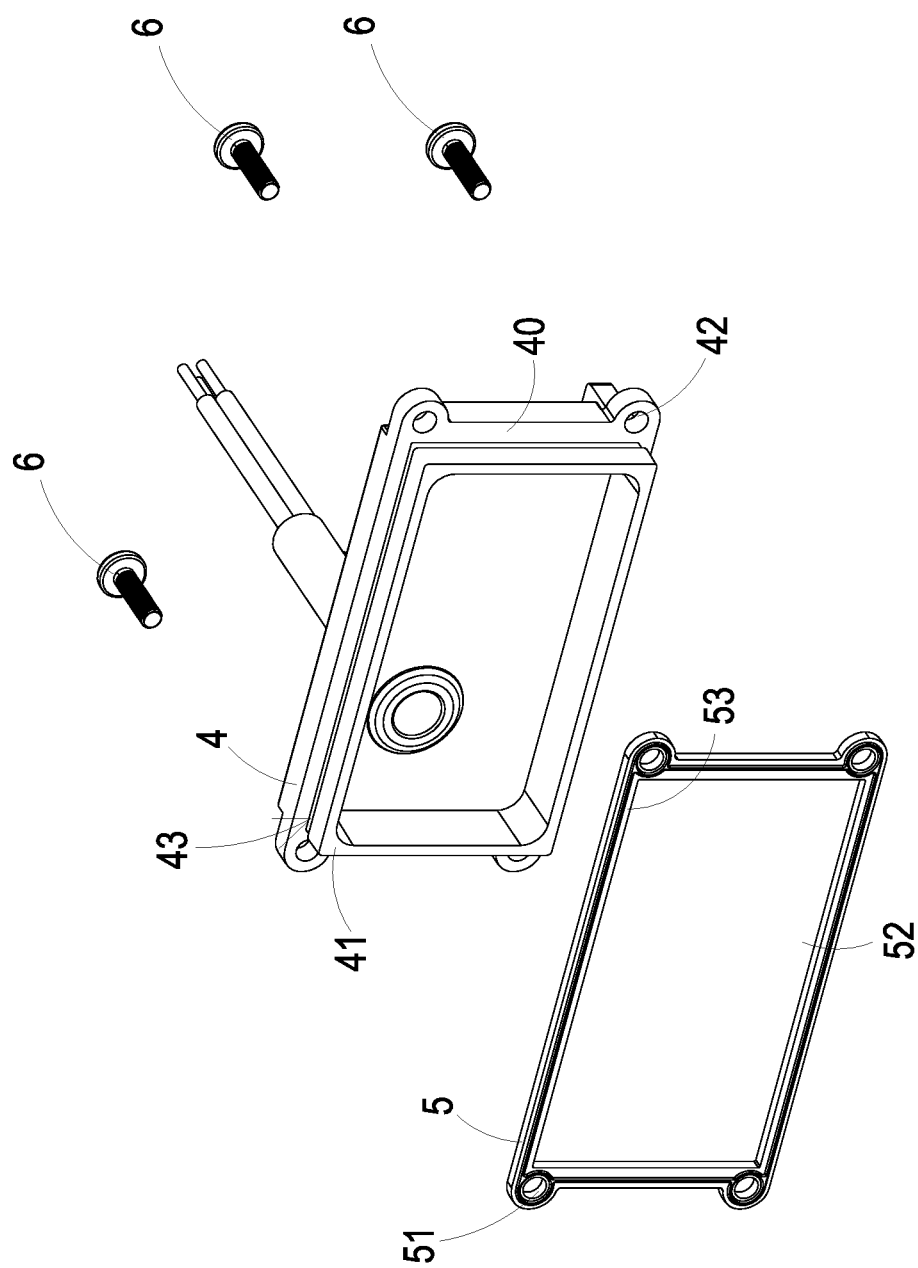
FIG. 3 is a schematic perspective view illustrating a non-metallic end cover, a sealing gasket and a fixing member of the waterproof casing of FIG. 1.

FIG. 1 is a schematic perspective view illustrating a waterproof casing according to a first embodiment of the present disclosure. FIG. 2 is a schematic exploded view illustrating the waterproof casing of FIG. 1. FIG. 3 is a schematic perspective view illustrating a non-metallic end cover, a sealing gasket and a fixing member of the waterproof casing of FIG. 1. As shown in FIGS. 1, 2 and 3, the waterproof casing 1 is configured to package a circuit board 2. The circuit board 2 comprises an antenna 21. Preferably but not exclusively, the antenna 21 is a near-field communication (NFC) antenna. In some embodiments, the waterproof casing 1 is applied but not limited to an outdoor wireless electronic device. For example, the outdoor wireless electronic device is a light emitting diode driver with a wireless function.

The waterproof casing 1 comprises a metallic casing 3, a non-metallic end cover 4 and a sealing gasket 5. The metallic casing 3 comprises an accommodation space 31 and a side opening 32. The accommodation space 31 is in communication with the side opening 32. The accommodation space 31 is configured to accommodate at least part of the circuit board 2. Moreover, the accommodation space 31 is configured to accommodate the antenna 21. The antenna 21 is disposed on the circuit board 2. Preferably, the antenna 21 is located on a side of the circuit board 2. As the circuit board 2 is disposed in the accommodation space 31, the antenna 21 is adjacent to and faces toward the side opening 32. In this embodiment, the metallic casing 3 is a rectangle structure having the side opening 32.

The non-metallic end cover 4 is made of a material with low-temperature resistance and ultraviolet resistance. In case that the non-metallic end cover 4 needs to be disposed in an environment under minus twenty degrees and high ultraviolet, the non-metallic end cover 4 is made of polycarbonate-siloxane copolymer material. The non-metallic end cover 4 is assembled with the metallic casing 3 through the side opening 32. The non-metallic end cover 4 covers the side opening 32 of the metallic casing 3 completely. Therefore, the non-metallic end cover 4 and the metallic casing 3 are combined to form a sealed box. The antenna 21 adjacent to the side opening 32 is adjacent to the non-metallic end cover 4. Therefore, the antenna 21 transmits a wireless signal to the exterior of the waterproof casing 1 through the non-metallic end cover 4. In some embodiments, the antenna 21 disposed on the circuit board 2 is in parallel with a surface 40 of the non-metallic end cover 4. The non-metallic end cover 4 further comprises a ring-shaped install portion 41. The ring-shaped install portion 41 is disposed on the surface 40 of the non-metallic end cover 4 and extending outwardly from the surface 40 of the non-metallic end cover 4 toward the metallic casing 3. The ring-shaped install portion 41 is disposed around the periphery of the surface 40 of the non-metallic end cover 4. As the metallic casing 3 and the non-metallic end cover 4 are assembled, the non-metallic end cover 4 covers the side opening 32 of the metallic casing 3 completely and the ring-shaped install portion 41 is disposed in the accommodation space 31 of the metallic casing 3.

The sealing gasket 5 is disposed around the ring-shaped install portion 41 of the non-metallic end cover 4. Preferably, the sealing gasket 5 is disposed on and abuts against the outer surface of the ring-shaped install portion 41 of the non-metallic end cover 4. As the metallic casing 3 and the non-metallic end cover 4 are assembled, the non-metallic end cover 4 covers the side opening 32 of the metallic casing 3 completely and the joint between the metallic casing 3 and the non-metallic end cover 4 is sealed by the sealing gasket 5. Therefore, the non-metallic end cover 4 is assembled with the metallic casing 3 tightly to prevent water or liquid from entering into the interior of the waterproof casing 1. The waterproof function is achieved.

Please refers to FIGS. 1, 2 and 3 again, the waterproof casing 1 further comprises at least one fixing member 6. As shown in FIGS. 1 and 2, the waterproof casing 1 comprises a plurality of fixing members 6 for example four fixing members 6. Preferably but not exclusively, each of the fixing members 6 is a screw. Moreover, the non-metallic end cover 4 further comprises at least one first through hole 42. As shown in FIG. 3, the non-metallic end cover 4 comprises a plurality of first through holes 42 for example four first through holes 42. The sealing gasket 5 further comprises at least one second through hole 51. As shown in FIG. 3, the sealing gasket 5 comprises a plurality of second through holes 51 for example four second through holes 51. The metallic casing 3 further comprises at least one third through hole 33. As shown in FIG. 2, the metallic casing 3 comprises a plurality of third through holes 33 for example four third through holes 33. Each of the third through holes 33, the corresponding first through hole 42 and the corresponding second through hole 51 are aligned to each other and disposed in a line. The amount of the first through holes 42 is equal to the amount of the second through holes 51. The amount of the first through holes 42 is equal to the amount of the third through holes 33. The amount of the fixing members 6 is equal to the amount of the first through holes 42 correspondingly. The non-metallic end cover 4 and the sealing gasket 5 are fixed to the metallic casing 3 by the plurality of fixing members 6. Each one of the fixing members 6 is penetrated through the corresponding first through hole 42 of the non-metallic end cover 4, the corresponding second through hole 51 of the sealing gasket 5 and the corresponding third through hole 33 of the metallic casing 3, and each one of the fixing members 6 is fixed within the corresponding third through hole 33 of the metallic casing 3. Therefore, the non-metallic end cover 4 and the metallic casing 3 are ensured to be stably kept in a tightly fitted state through the sealing gasket 5 so as to maintain the waterproof capability of the waterproof casing 1.

In some embodiments, the ring-shaped install portion 41 further comprises a surrounding groove 43. The surrounding groove 43 is concavely formed on an outer surface of the ring-shaped install portion 41 and surrounds the outer surface of the ring-shaped install portion 41. The sealing gasket 5 comprises a hollow portion 52 and an engaging part 53. The hollow portion 52 is located at the middle area of the sealing gasket 5. The engaging part 53 is disposed on an inner surface of the sealing gasket 5 and adjacent to the hollow portion 52. The engaging part 53 surrounds the inner surface of the hollow portion 52 and is corresponding in position to the surrounding groove 43 of the ring-shaped install portion 41. As the ring-shaped install portion 41 and the sealing gasket 5 are assembled, the engaging part 53 of the sealing gasket 5 is disposed within and engaged with the surrounding groove 43 of the ring-shaped install portion 41. Therefore, the sealing gasket 5 is fixed on the ring-shaped install portion 41 securely so as to prevent the sealing gasket 5 from being moved.

From the above descriptions, the present disclosure provides a waterproof casing. The waterproof casing of the present disclosure comprises a metallic casing, a non-metallic end cover and a sealing gasket. As the metallic casing, the non-metallic end cover and the sealing gasket are assembled together, the non-metallic end cover covers a side opening of the metallic casing. Therefore, the antenna can transmit the wireless signal to the exterior of the waterproof casing through the non-metallic end cover without being blocked by the metallic casing. Moreover, the joint between the metallic casing and the non-metallic end cover is sealed by the sealing gasket so as to prevent water or liquid from entering into the interior of the waterproof casing. Comparing with the conventional waterproof casing, the waterproof casing of the present disclosure has excellent waterproof function and allows the antenna therein to perform the wireless function at the same time.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A waterproof casing for packaging a circuit board, the circuit board comprising an antenna, the waterproof casing comprising:

a metallic casing comprising an accommodation space and a side opening in communication with each other, wherein the accommodation space is configured to accommodate at least part of the circuit board, and the antenna is adjacent to the side opening;

a non-metallic end cover covering the side opening and combined with the metallic casing to form a sealed box, wherein the non-metallic end cover comprises a ring-shaped install portion disposed on a surface thereof and extending outwardly from the surface thereof, wherein the ring-shaped install portion is disposed in the accommodation space as the non-metallic end cover covers the side opening; and a sealing gasket disposed around the ring-shaped install portion of the non-metallic end cover, wherein a joint between the metallic casing and the non-metallic end cover is sealed by the sealing gasket.

2. The waterproof casing according to claim 1, wherein the non-metallic end cover is made of polycarbonate-siloxane copolymer material.

3. The waterproof casing according to claim 1, wherein the antenna disposed on the circuit board is in parallel with the surface of the non-metallic end cover.

4. The waterproof casing according to claim 1, further comprising at least one fixing member, wherein the non-metallic end cover comprises at least one first through hole, the sealing gasket comprises at least one second through hole, and the metallic casing comprises at least one third through hole, wherein the at least one first through hole, the at least one second through hole and the at least one third through hole are aligned to each other, wherein each of the at least one fixing member is penetrated through the corresponding first through hole, the corresponding second through hole and the corresponding third through hole, and the fixing member is fixed within the corresponding third through hole, so that the non-metallic end cover and the sealing gasket are fixed to the metallic casing.

5. The waterproof casing according to claim 1, wherein the ring-shaped install portion comprises a surrounding groove, and the surrounding groove is concavely formed on an outer surface of the ring-shaped install portion, wherein the sealing gasket comprises an engaging part, the engaging part of the sealing gasket is disposed within and engaged with the surrounding groove, so that the sealing gasket is fixed on the ring-shaped install portion.

* * * * *